United States Patent
Lin et al.

(10) Patent No.: US 12,328,122 B2
(45) Date of Patent: Jun. 10, 2025

(54) ELECTRONIC DEVICE

(71) Applicant: Innolux Corporation, Miaoli County (TW)

(72) Inventors: Yi-Hung Lin, Miaoli County (TW); Chung-Le Chen, Miaoli County (TW); Shuo-Ting Hong, Miaoli County (TW); Yu-Ti Huang, Miaoli County (TW); Yu-Hsiang Chiu, Miaoli County (TW); Nai-Fang Hsu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/663,116

(22) Filed: May 14, 2024

(65) Prior Publication Data

US 2024/0297638 A1 Sep. 5, 2024

Related U.S. Application Data (63) Continuation of application No. 17/945,092, filed on Sep. 15, 2022, now Pat. No. 11,990,906.

(60) Provisional application No. 63/251,046, filed on Oct. 1, 2021.

(30) Foreign Application Priority Data

Jul. 8, 2022 (CN) .......................... 202210801664.2

(51) Int. Cl.
  *H03K 3/01* (2006.01)
  *H03K 17/687* (2006.01)

(52) U.S. Cl.
  CPC ............. *H03K 3/01* (2013.01); *H03K 17/687* (2013.01)

(58) Field of Classification Search
  None
  See application file for complete search history.

(56) References Cited

U.S. PATENT DOCUMENTS

| | | | | |
|---|---|---|---|---|
| 6,888,318 B2* | 5/2005 | Childs | ................... | G09G 3/3258 |
| | | | | 315/169.3 |
| 2004/0251840 A1* | 12/2004 | Sun | ....................... | G09G 3/3283 |
| | | | | 315/169.3 |

* cited by examiner

*Primary Examiner* — Kenneth B Wells
(74) *Attorney, Agent, or Firm* — JCIPRNET (57) ABSTRACT

Disclosed is an electronic device including a tunable element, a first power supply circuit, and a second power supply circuit. The first power supply circuit and the second power supply circuit are electrically connected to the tunable element. The first power supply circuit drives the tunable element during a first time period. The second power supply circuit drives the tunable element during a second time period.

9 Claims, 8 Drawing Sheets

ELECTRONIC DEVICE

CROSS-REFERENCE TO RELATED APPLICATION

This application is a continuation application of and claims the priority benefit of U.S. Pat. No. 11,990,906, filed on Sep. 15, 2022, which claims the priority benefits of U.S. provisional application Ser. No. 63/251,046, filed on Oct. 1, 2021 and Chinese application no. 202210801664.2, filed on Jul. 8, 2022. The entirety of each of the above-mentioned patent applications is hereby incorporated by reference herein and made a part of this specification.

BACKGROUND

Technical Field

The disclosure relates to an electronic device. In particular, the disclosure relates to an electronic device including a tunable element.

Description of Related Art

Generally, an electronic device may drive an electronic element through a driving element. The driving element may provide a driving power to the electronic element (e.g., a pixel circuit or a tunable element). However, the driving element may deteriorate under long-term operation. As such, stability during operation of the electronic element may be reduced on the basis of an abnormal driving power provided by the deteriorating driving elements. Therefore, how to reduce the likelihood of deterioration of the driving element to improve the stability during operation of the electronic element is one of research topics for those skilled in the related art.

SUMMARY

The disclosure provides an electronic device, improving stability during long-term operation of an electronic element.

According to an embodiment of the disclosure, an electronic device includes a tunable element, a first power supply circuit, and a second power supply circuit. The first power supply circuit and the second power supply circuit are electrically connected to the tunable element. The first power supply circuit drives the tunable element during a first time period. The second power supply circuit drives the tunable element during a second time period.

Based on the foregoing, the first power supply circuit and the second power supply circuit time-divisionally drive the tunable element. The first power supply circuit and the second power supply circuit may rest alternately. As such, the likelihood of deterioration of the first power supply circuit and the second power supply circuit under long-term operation can be reduced, thus improving stability during operation of the electronic device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The disclosure may be understood with reference to the following detailed description with the drawings. Note that for clarity of description and ease of understanding, the drawings of the disclosure show a part of an electronic device, and certain elements in the drawings may not be drawn to scale. In addition, the number and size of each device shown in the drawings only serve for exemplifying instead of limiting the scope of the disclosure.

Certain terms are used throughout the description and the appended claims to refer to specific elements. As to be understood by those skilled in the art, electronic device manufacturers may refer to an element by different names. Herein, it is not intended to distinguish between elements that have different names instead of different functions. In the following description and claims, terms such as "include", "comprise", and "have" are used in an open-ended manner, and thus should be interpreted as "including, but not limited to". Therefore, the terms "include", "comprise", and/or "have" used in the description of the disclosure denote the presence of corresponding features, regions, steps, operations, and/or elements but are not limited to the presence of one or more corresponding features, regions, steps, operations, and/or elements.

It should be understood that when one element is referred to as being "coupled to", "connected to", or "conducted to" another element, the one element may be directly connected to the another element with electrical connection established, or intervening elements may also be present in between these elements for electrical interconnection (indirect electrical connection). Comparatively, when one element is referred to as being "directly coupled to", "directly conducted to", or "directly connected to" another element, no intervening elements are present in between.

Although terms such as first, second, and third may be used to describe different diverse constituent elements, such constituent elements are not limited by the terms. The terms are used only to discriminate one constituent element from other constituent elements in the description. In the claims, the terms first, second, third, and so on may be used in accordance with the order of claiming elements instead of using the same terms. Accordingly, a first constituent element in the following description may be a second constituent element in the claims.

The electronic device of the disclosure may include, but is not limited to, a display device, an antenna device, a sensing device, a light-emitting device, a touch display, a curved display, or a free-shape display. The electronic device may include a bendable or flexible electronic device. The electronic device may include, for example but not limited to, liquid crystal, light-emitting diode, quantum dot (QD), fluorescence, phosphor, other suitable display media, or a combination thereof. The electronic element may include, for example but not limited to, an organic light-emitting diode (OLED), a mini LED, a micro LED, or a quantum dot LED (including QLED and QDLED), other suitable materials, or a combination thereof. The display device may include a tiled display device, for example but not limited thereto. The antenna device may be, for example but not limited to, a liquid crystal antenna, a varactor antenna. The antenna device may include a tiled antenna device, for example but not limited thereto. Note that the electronic device may be any arrangement or combination of the above, but not limited thereto. In addition, the shape of the electronic device may be a rectangle, a circle, a polygon, a shape with a curved edge, or other suitable shapes. The electronic device may have a peripheral system, for example, a driving system, a control system, or a light source system, to support the display device, the antenna device, or the tiled device, but the disclosure is not limited thereto. The sensing device may include a camera, an infrared sensor, or a fingerprint sensor, and the disclosure is not limited thereto. In some embodiments, the sensing device may also include a flash, an infrared (IF) light source, other sensors, electronic elements, or a combination thereof, but not limited thereto.

In the embodiments of the disclosure, terms "pixel" or "pixel unit" are used as a unit for describing a specific region including at least one functional circuit for at least one specific function. The region of a "pixel" depends on the unit for providing a specific function. Adjacent pixels may share the same parts or wires, but may also include their own specific parts therein. For example, adjacent pixels may share a same scan line or a same data line, but the pixels may also have their own transistors or capacitors.

Note that features in different embodiments described below may be replaced, recombined, or mixed with each other to form another embodiment without departing from the spirit of the disclosure.

Figure 1:
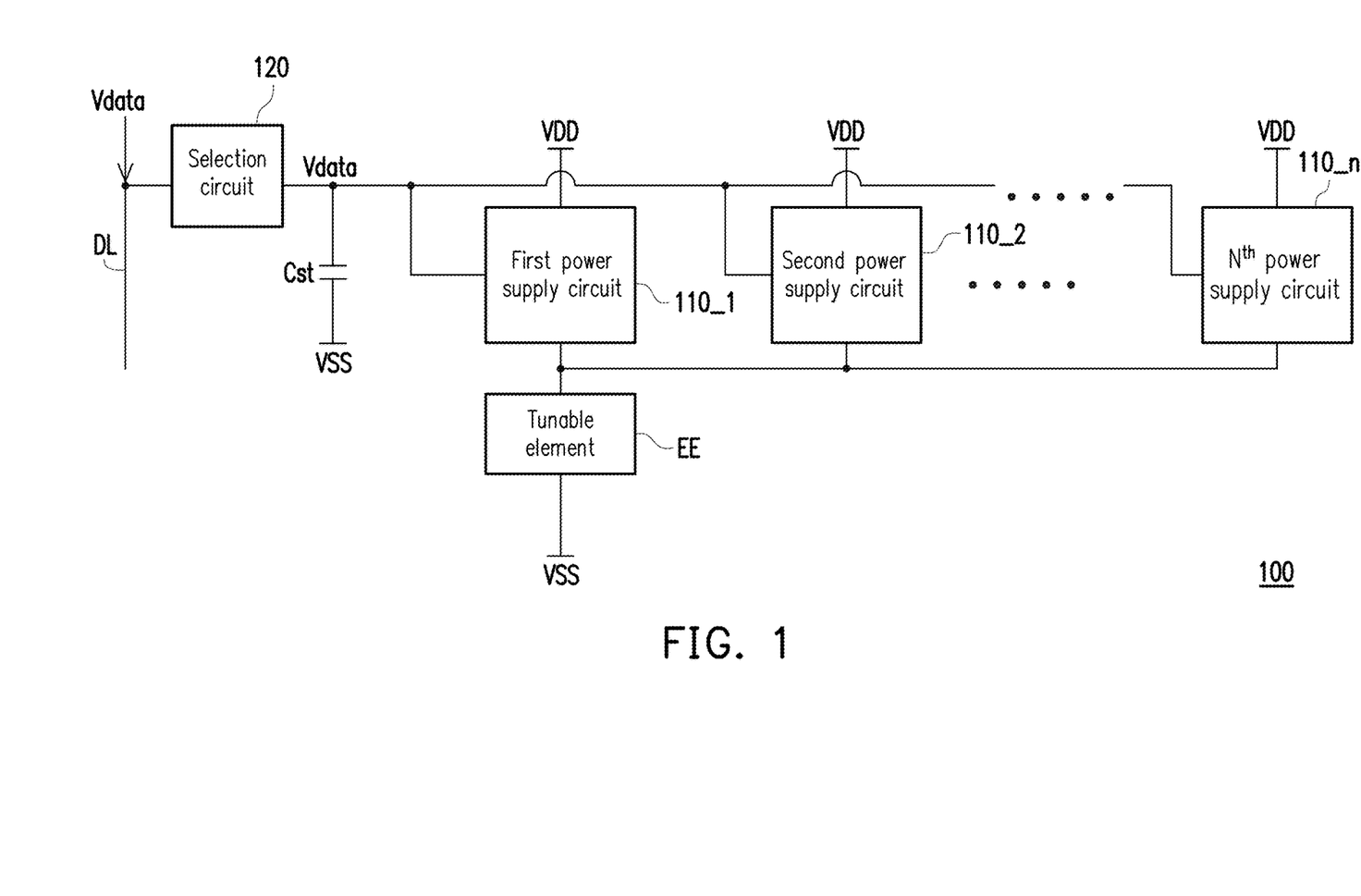
FIG. 1 is a schematic diagram of an electronic device according to a first embodiment of the disclosure.

With reference to FIG. 1, FIG. 1 is a schematic diagram of an electronic device according to a first embodiment of the disclosure. Operated in this embodiment, an electronic device 100 includes a tunable element EE and a first power supply circuit 110_1 to an $n^{th}$ power supply circuit 110_n. The first power supply circuit 110_1 may be electrically connected to the tunable element EE. The first power supply circuit 110_1 may drive the tunable element EE during a first time period. The second power supply circuit 110_2 may be electrically connected to the tunable element EE. The second power supply circuit 110_2 may drive the tunable element EE during a second time period. For example, the first time period is adjacent to the second time period. By analogy, the $n^{th}$ power supply circuit 110_n may drive the tunable element EE during an $n^{th}$ time period. In other words, the first power supply circuit 110_1 to the $n^{th}$ power supply circuit 110_n time-divisionally drive the tunable element EE during different time periods. According to some embodiments, the power supply circuit may be a driving circuit.

According to some embodiments, the first power supply circuit 110_1 to the $n^{th}$ power supply circuit 110_n time-divisionally drive the tunable element. The first power supply circuit 110_1 to the $n^{th}$ power supply circuit 110_n may rest alternately. As such, the likelihood of deterioration of the first power supply circuit 110_1 to the $n^{th}$ power supply circuit 110_n under long-term operation can be reduced, thus improving the stability during long-term operation of the first power supply circuit 110_1 to the $n^{th}$ power supply circuit 110_n and the tunable element EE.

The power supply circuit of the disclosure may include a plurality of power supply circuits, and is not limited to this embodiment.

In this embodiment, the first power supply circuit 110_1 to the $n^{th}$ power supply circuit 110_n each receive a same high reference voltage VDD. According to some embodiments, the first time period and the second time period do not overlap. According to some embodiments, the first time period to the nth time period do not overlap each other.

In this embodiment, the electronic device 100 is adapted for the field of wireless transmission, for example. For example, the electronic device 100 is adapted for an antenna device, for example. The tunable element EE may be a communication element, for example, a varactor or a radio frequency radiation element. According to some embodiments, specific parameters (e.g., physical parameters) of the tunable element may be adjusted depending on signals applied thereto. The specific parameters may include, for example, a capacitance, an inductance, a resistance, a dielectric constant, or a combination thereof.

Figure 8:
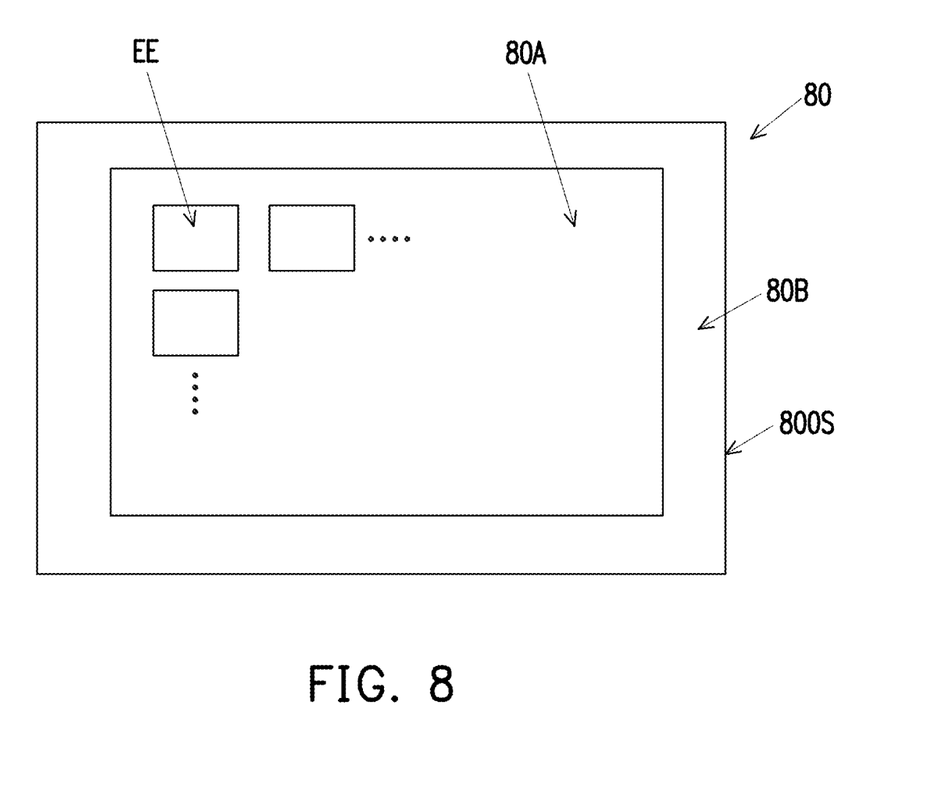
FIG. 8 is a layout diagram of a substrate of an electronic device according to an embodiment of the disclosure.

According to some embodiments, as shown in FIG. 8, the electronic device 100 may include a substrate 80. The substrate 80 includes an active area 80A and a peripheral area 80B. The peripheral area 80B is adjacent to the active area 80A. For example, the active area 80A may be disposed at a central position of the substrate 80, and the peripheral area 80B may be disposed at an edge position of the substrate 80 (and the disclosure is not limited thereto). To be specific, the peripheral area 80B may be clo2ser to a side 800S of the substrate 80 than the active area 80A. The active area 80A may be an area that transmits and receives electromagnetic waves. According to some embodiments, the tunable element EE may be disposed on the substrate 80 and within the active area 80A. For example, as shown in FIG. 8, a plurality of tunable elements EE may be disposed within the active area 80A of the substrate 80. According to some embodiments, the first power supply circuit 110_1 to the $n^{th}$ power supply circuit 110_n may be disposed within the active area 80A. According to other embodiments, the first power supply circuit 110_1 to the $n^{th}$ power supply circuit 110_n may be disposed within the peripheral area 80B. According to some embodiments, the substrate 80 may be a rigid substrate or a flexible substrate. For example, the rigid substrate may be glass, and the flexible substrate may be plastics or a polymer, but the disclosure is not limited thereto.

In addition, in this embodiment, as shown in FIG. 1, the electronic device 100 further includes a selection circuit 120 and a storage capacitor Cst. The selection circuit 120 is electrically connected to a data line DL. The selection circuit 120 receives a data voltage Vdata from the data line DL, and provides the data voltage Vdata to the first power supply circuit 110_1 to the $n^{th}$ power supply circuit 110_n. The storage capacitor Cst is coupled between the selection circuit 120 and a low reference voltage VSS. The storage capacitor Cst is configured to maintain a voltage value of the data voltage Vdata.

p For example, in this embodiment, the data voltage Vdata may be configured to change the electronic properties of the tunable element EE. In addition, the data voltage Vdata may be configured to control the operation of compensating for the first power supply circuit 110_1 to the nth power supply circuit 110_n.

Figure 2:
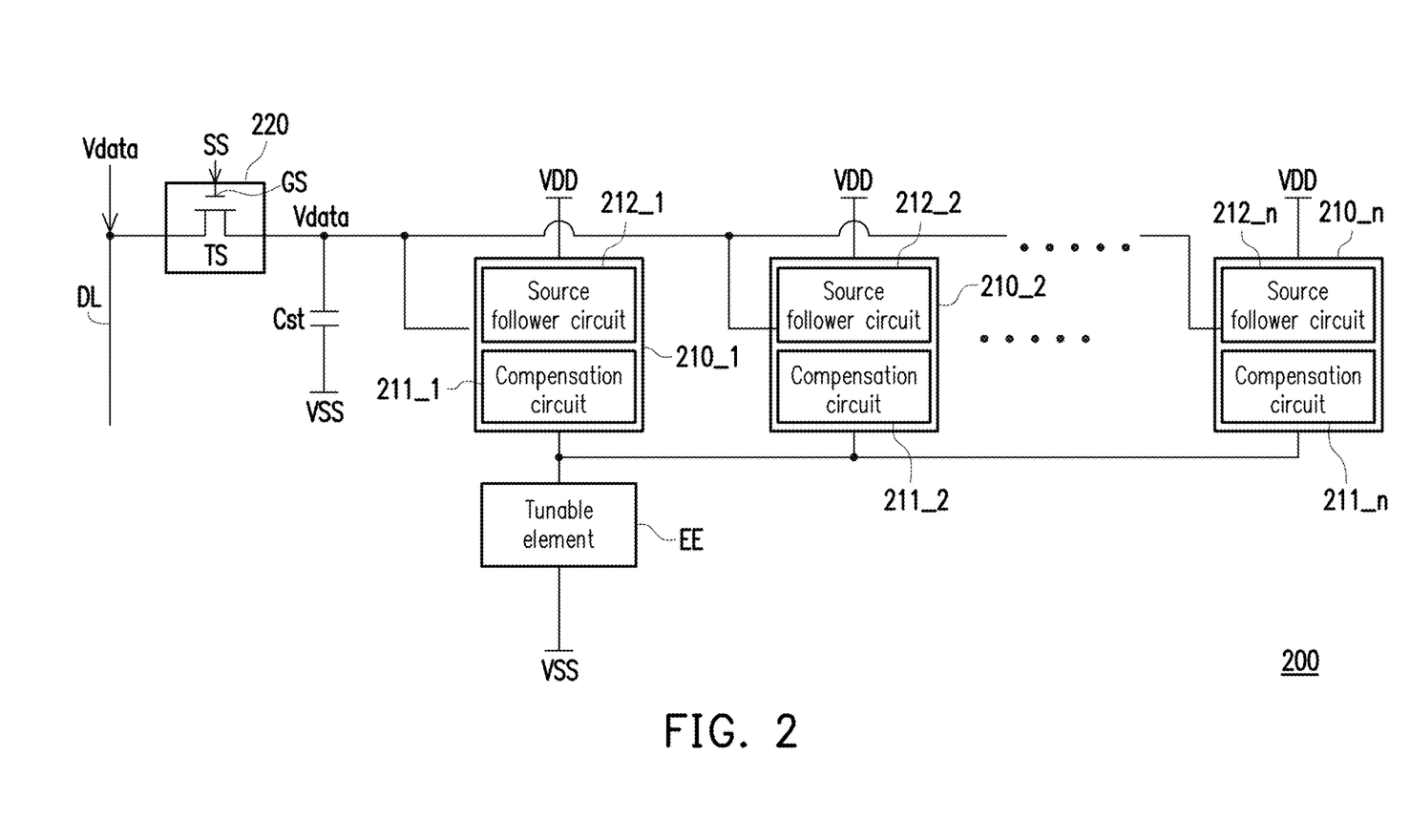
FIG. 2 is a schematic diagram of an electronic device according to a second embodiment of the disclosure.

With reference to FIG. 2, FIG. 2 is a schematic diagram of an electronic device according to a second embodiment of the disclosure. In this embodiment, an electronic device 200 includes the tunable element EE, a first power supply circuit 210_1 to an $n^{th}$ power supply circuit 210_n, a selection circuit 220, and the storage capacitor Cst. The first power supply circuit 210_1 to the $n^{th}$ power supply circuit 210_n time-divisionally drive the tunable element EE during different time periods.

The first power supply circuit 210_1 includes a compensation circuit 211_1. The second power supply circuit 210_2 includes a compensation circuit 211_2. Similarly, the $n^{th}$ power supply circuit 210_n includes a compensation circuit 211_n. In this embodiment, the compensation circuits 211_1 to 211_n may respectively compensate for the corresponding power supply circuits with the data voltage Vdata. For example, the compensation circuit 211_1 may compensate for the first power supply circuit 210_1 with the data voltage Vdata.

The first power supply circuit 210_1 further includes a source follower circuit 212_1. The compensation circuit 211_1 may compensate for the source follower circuit 212_1 with the data voltage Vdata. For example, the source follower circuit 212_1 utilizes the high reference voltage VDD to provide a driving electrical energy (e.g., a driving current or a driving voltage) to drive the tunable element EE. However, leakage current may occur during operation of the tunable element EE based on differences in the manufacturing process or circumstances (e.g., temperature or humidity) of the operating environment of the tunable element EE. The leakage current of the tunable element EE may influence the driving electrical energy provided by the source follower circuit 212_1. Therefore, the compensation circuit 211_1 may compensate for the driving electrical energy (e.g., a driving current or a driving voltage) provided by the source follower circuit 212_1 with the data voltage Vdata.

Similarly, the second power supply circuit 210_2 further includes a source follower circuit 212_2. The compensation circuit 211_2 may compensate for the source follower circuit 212_2 with the data voltage Vdata. The $n^{th}$ power supply circuit 210_n further includes a source follower circuit 212_n. The compensation circuit 211_n may compensate for the source follower circuit 212_n with the data voltage Vdata.

As shown in FIG. 2, in this embodiment, the selection circuit 220 may be electrically connected to at least one, some, or all of the power supply circuits 210_1 to 210_n. For example, the selection circuit 220 is electrically connected to the compensation circuits 211_1 to 211_n. The selection circuit 220 provides the data voltage Vdata according to a voltage value of a selection signal SS, and provides the data voltage Vdata to the compensation circuits 211_1 to 211_n. The selection circuit 220 may include a scan transistor TS. A first terminal of the scan transistor TS is electrically connected to the data line DL to receive the data voltage Vdata. A second terminal of the scan transistor TS is electrically connected to the compensation circuits 211_1 to 211_n. A control terminal GS of the scan transistor TS receives the selection signal SS. The scan transistor TS may be turned off according to the selection signal SS. Therefore, the scan transistor TS stops transmitting the data voltage Vdata. The scan transistor TS may be turned on according to the selection signal SS. Therefore, the scan transistor TS may transmit the data voltage Vdata on the data line DL to the compensation circuits 211_1 to 211_n. According to some embodiments, the selection circuit 220 may be disposed within the active area 80A of the substrate 80, and the first power supply circuit 210_1 to the $n^{th}$ power supply circuit 210_n may be disposed within the active area 80A.

As shown in FIG. 2, according to some embodiments, the selection circuit 220 may be configured to provide the data voltage Vdata according to the voltage value of the selection signal SS, and to provide the data voltage Vdata to the first power supply circuit and the second power supply circuit. To be specific, the selection circuit 220 may receive the selection signal SS during the turn-on time of the selection circuit 220. The turn-on time may be referred to as a scan time. The same scan time may be divided into a plurality of time periods, for example, a first time period, a second time period, . . . , and an $n^{th}$ time period. For example, the scan time may include a first time period and a second time period. The first time period and the second time period may not overlap. According to some embodiments, the first time period to the $n^{th}$ time period may not overlap each other.

In this embodiment, the scan transistor TS may be implemented with an N-type transistor. The scan transistor TS is an N-type thin film transistor or an NMOS transistor, for example. In other embodiments, the scan transistor TS may be implemented with a P-type transistor. In these embodiments, the scan transistor TS is turned off according to a high voltage value of the selection signal SS and turned on according to a low voltage value of the selection signal SS. To simplify the description in the specification of the disclosure, the transistor is exemplified by an N-type transistor, but the disclosure is not limited thereto. A P-type transistor may also be adopted for the transistor, which will not be repeatedly described here.

Figure 3:
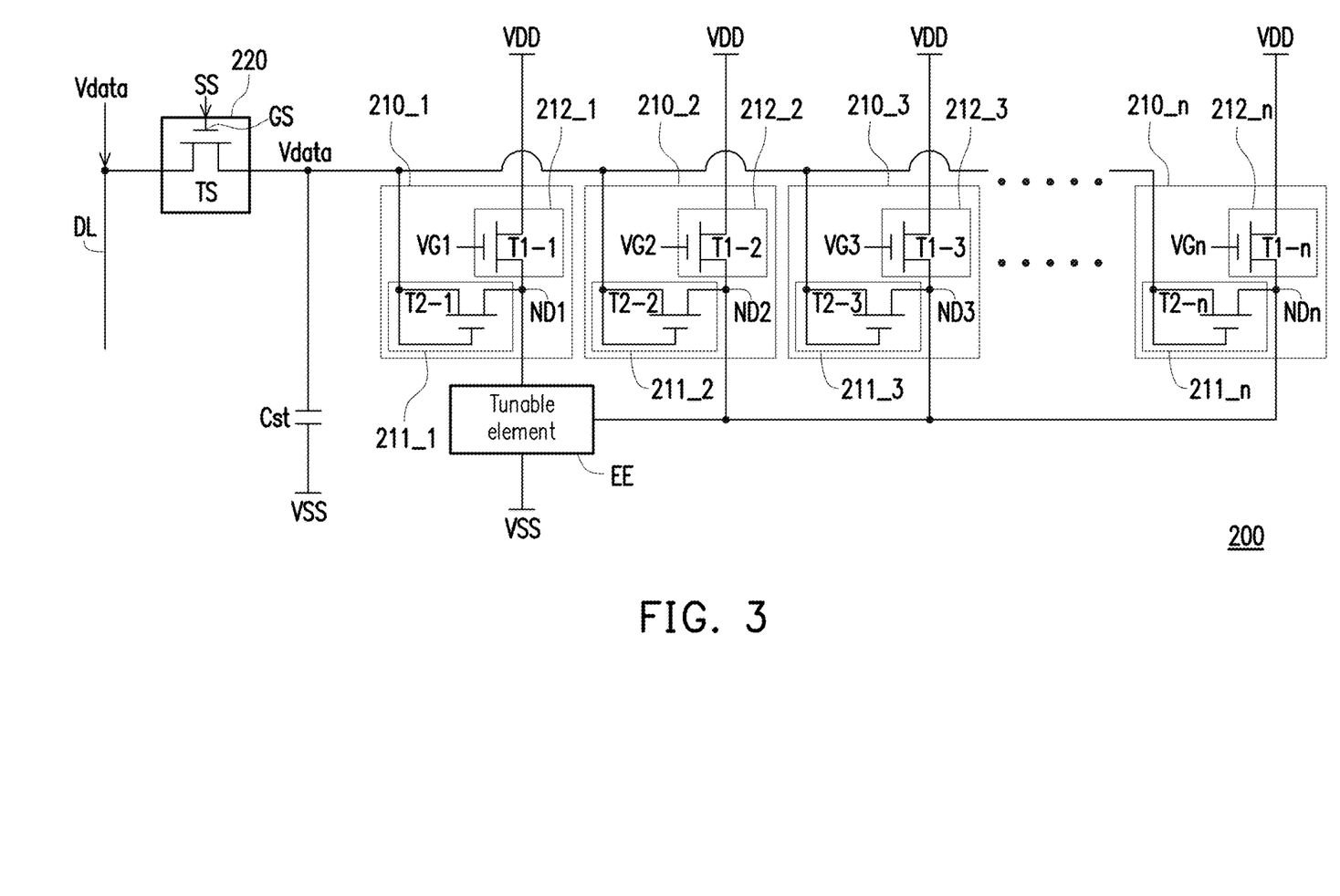
FIG. 3 is a circuit diagram of an electronic device according to the second embodiment of the disclosure.
Figure 4:
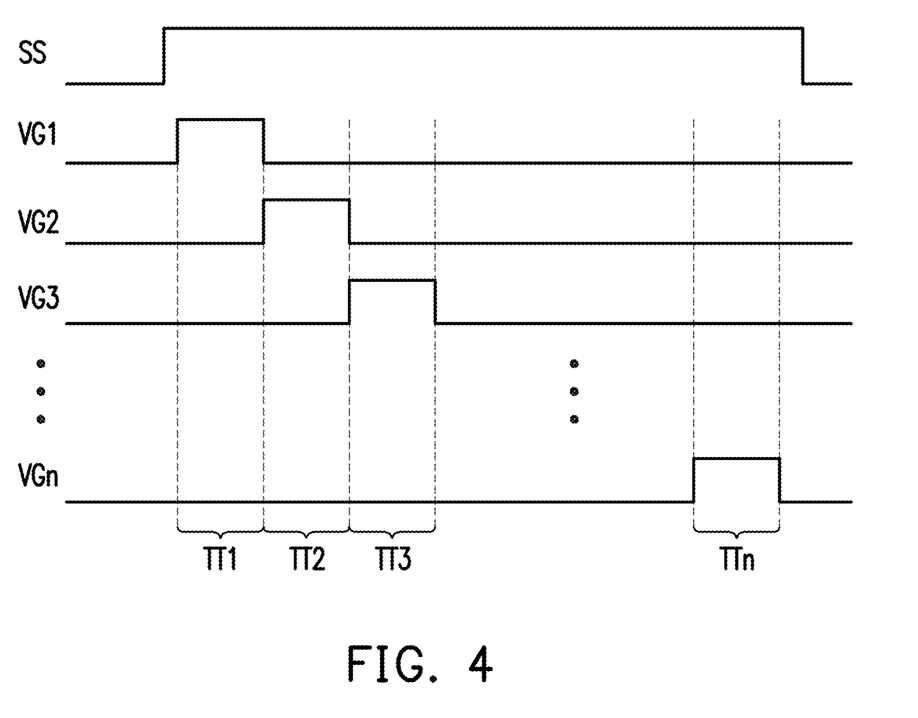
FIG. 4 is a timing diagram according to the second embodiment of the disclosure.

For further description, with reference to FIG. 3 and FIG. 4 together, FIG. 3 is a circuit diagram of an electronic device according to the second embodiment of the disclosure, and FIG. 4 is a timing diagram according to the second embodiment of the disclosure. In this embodiment, control signals VG1 to VGn may have a positive pulse during different time periods TT1 to TTn. For example, the scan transistor TS may be turned on according to the selection signal SS during the scan time. The control signal VG1 has a positive pulse during the time period TT1. The control signal VG2 has a positive pulse during the time period TT2. The control signal VG3 has a positive pulse during the time period TT3. Similarly, the control signal VGn has a positive pulse during the time period TTn. The time periods TT1 to TTn may be adjacent to each other and do not overlap each other. For example, the first time period TT1 is adjacent to the second time period TT2. Therefore, the source follower circuits 212_1 to 212_n sequentially provide approximately the same driving electrical energy during the different time periods TT1 to TTn based on the control signals VG1 to VGn. In this embodiment, the source follower circuit 212_1 is electrically connected to a first node ND1. In other words, the source follower circuit 212_1 is electrically connected to the tunable element EE through the first node ND1. The source follower circuit 212_1 includes a control terminal. A voltage at the first node ND1 may follow a voltage at the control terminal of the source follower circuit 212_1, and the voltage at the first node ND1 may be supplied to the tunable element EE. The source follower circuit 212_1 is implemented with a power supply transistor T1-1. A first terminal of the power supply transistor T1-1 receives the high reference voltage VDD. A second terminal of the power supply transistor T1-1 is electrically connected to the first node ND1. A control terminal of the power supply transistor T1-1 receives the control signal VG1. The power supply transistor T1-1 may be implemented with an N-type transistor. The power supply transistor T1-1 is an N-type thin film transistor or an NMOS transistor, for example. Therefore, the voltage at the first node ND1 may follow a voltage value of the control signal VG1. In other embodiments, a P-type transistor may be adopted for the power supply transistor T1-1, which will not be repeatedly described here. According to some embodiments, the time period TT1 and the time period TT2 may partially overlap, that is, the pulse of the control signal VG1 and the pulse of the control signal VG2 may partially overlap.

As shown in FIG. 3, the compensation circuit 211_1 includes a compensation transistor T2-1. A first terminal of the compensation transistor T2-1 and a control terminal of the compensation transistor T2-1 are electrically connected to the second terminal of the scan transistor TS. A second terminal of the compensation transistor T2-1 is electrically connected to the first node ND1. The compensation transistor T2-1 is electrically connected between the second terminal of the scan transistor TS and the first node ND1 in a diode-connected manner. The first terminal of the scan transistor TS is electrically connected to the data line DL to receive the data voltage Vdata.

For example, leakage current may occur during operation of the tunable element EE. A voltage value at the first node ND1 may be lower than the design voltage value. Once the voltage value at the first node ND1 is dropped, the voltage difference between the first terminal of the power supply transistor T1-1 and the second terminal of the power supply transistor T1-1 may increase, thus increasing the voltage stress of the power supply transistor T1-1. In this embodiment, the compensation circuit 211_1 compensates for the voltage value at the first node ND1 with the data voltage Vdata during the first time period, so that the voltage value at the first node ND1 reaches the design voltage value. The voltage difference between the first terminal of the power supply transistor T1-1 and the second terminal of the power supply transistor T1-1 is not increased. Therefore, the voltage stress of the power supply transistor T1-1 is not increased.

In this embodiment, the source follower circuit 212_2 in the second power supply circuit 210_2 is electrically connected to the tunable element EE through a second node ND2. The source follower circuit 212_2 includes a control terminal. A voltage at the second node ND2 may follow a voltage at the control terminal of the source follower circuit 212_2, and the voltage at the second node ND2 may be supplied to the tunable element EE. The source follower circuit 212_2 is implemented with a power supply transistor T1-2. A first terminal of the power supply transistor T1-2 receives the high reference voltage VDD. A second terminal of the power supply transistor T1-2 is electrically connected to the second node ND2. A control terminal of the power supply transistor T1-2 receives the control signal VG2. The power supply transistor T1-2 may be implemented with an N-type transistor. The power supply transistor T1-2 is an N-type thin film transistor or an NMOS transistor, for example. Therefore, the voltage at the second node ND2 may follow a voltage value of the control signal VG2.

The compensation circuit 211_2 includes a compensation transistor T2-2. A first terminal of the compensation transistor T2-2 and a control terminal of the compensation transistor T2-2 are electrically connected to the second terminal of the scan transistor TS. A second terminal of the compensation transistor T2-2 is electrically connected to the second node ND2. In this embodiment, the compensation circuit 211_2 compensates for a voltage value at the second node ND2 with the data voltage Vdata during the second time period, so that the voltage value at the second node ND2 reaches the design voltage value. Therefore, the voltage stress of the power supply transistor T1-2 is not increased.

In this embodiment, the source follower circuit 212_n in the $n^{th}$ power supply circuit 210_n is electrically connected to the tunable element EE through an $n^{th}$ node NDn. The source follower circuit 212_n includes a control terminal. A voltage at the $n^{th}$ node NDn may follow a voltage at the control terminal of the source follower circuit 212_n, and the voltage at the $n^{th}$ node NDn may be supplied to the tunable element EE. The source follower circuit 212_n is implemented with a power supply transistor T1-n. A first terminal of the power supply transistor T1-n receives the high reference voltage VDD. A second terminal of the power supply transistor T1-n is electrically connected to the $n^{th}$ node NDn. A control terminal of the power supply transistor T1-n receives the control signal VGn. The power supply transistor T1-n may be implemented with an N-type transistor. The power supply transistor T1-n is an N-type thin film transistor or an NMOS transistor, for example. Therefore, the voltage at the $n^{th}$ node NDn may follow a voltage value of the control signal VGn.

The compensation circuit 211_n includes a compensation transistor T2-n. A first terminal of the compensation transistor T2-n and a control terminal of the compensation transistor T2-n are electrically connected to the second terminal of the scan transistor TS. A second terminal of the compensation transistor T2-n is electrically connected to the $n^{th}$ node NDn. In this embodiment, the compensation circuit 211_n compensates for a voltage value at the $n^{th}$ node NDn with the data voltage Vdata during the $n^{th}$ time period, so that the voltage value at the $n^{th}$ node NDn reaches the design voltage value. Therefore, the voltage stress of the power supply transistor T1-n is not increased.

Figure 5:
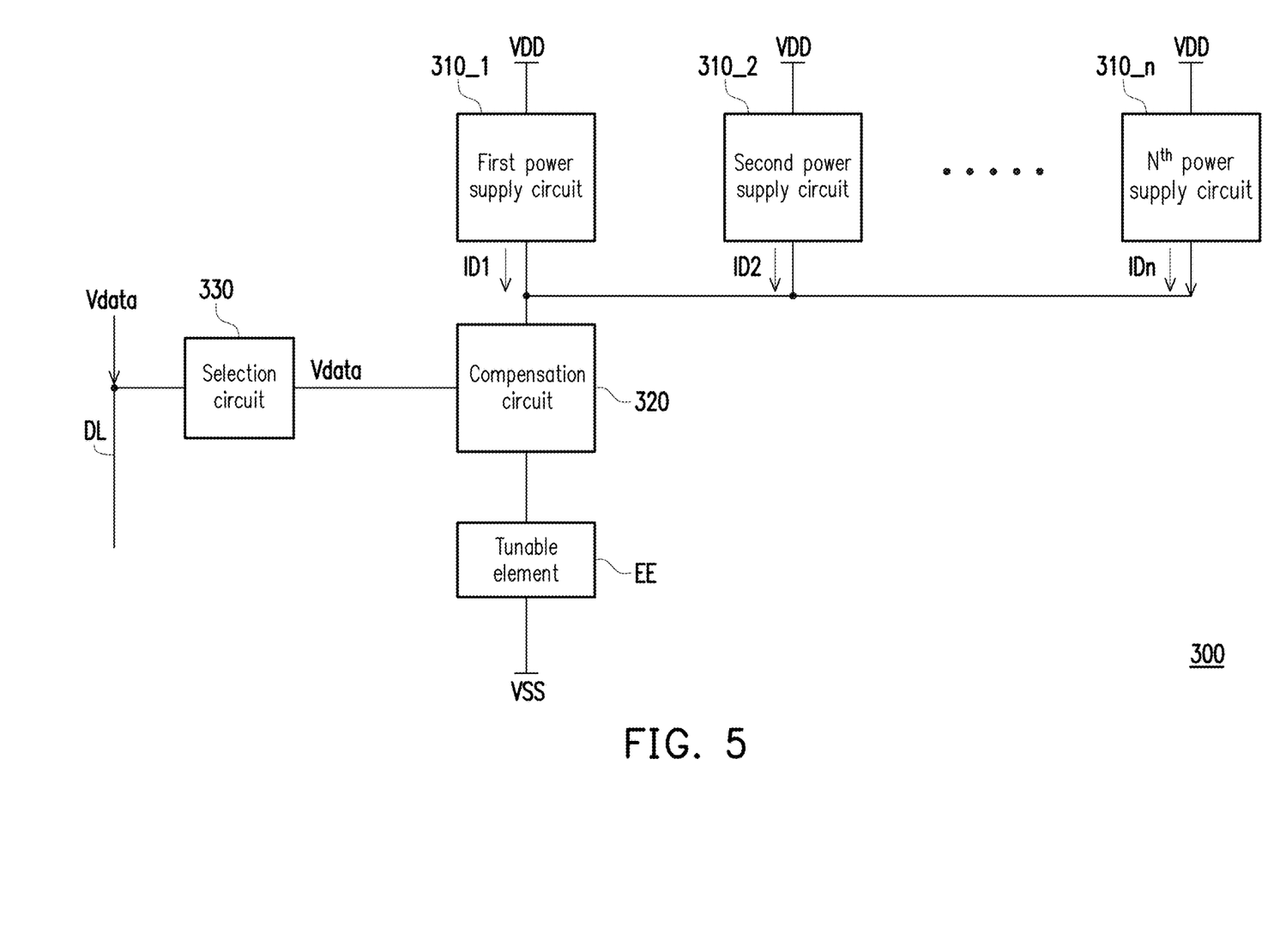
FIG. 5 is a schematic diagram of an electronic device according to a third embodiment of the disclosure.

With reference to FIG. 5, FIG. 5 is a schematic diagram of an electronic device according to a third embodiment of the disclosure. In this embodiment, an electronic device 300 includes the tunable element EE, a first power supply circuit 310_1 to an $n^{th}$ power supply circuit 310_n, a compensation circuit 320, and a selection circuit 330. The compensation circuit 320 is electrically connected between the first power supply circuit 310_1 and the tunable element EE. The first power supply circuit 310_1 may provide a first driving current ID1 during a first time period. The second power supply circuit 310_2 may provide a second driving current ID2 during a second time period. The $n^{th}$ power supply circuit 310_n may provide an $n^{th}$ driving current IDn during an $n^{th}$ time period. The first driving current ID1 to the $n^{th}$ driving current IDn may be time-divisionally provided to the tunable element EE.

In this embodiment, the compensation circuit 320 is electrically connected to the first power supply circuit 310_1 to the $n^{th}$ power supply circuit 310_n, the selection circuit 330, and the tunable element EE. One of the first driving current ID1 to the $n^{th}$ driving current IDn may flow via the compensation circuit 320 through the tunable element EE during different time periods. Therefore, the compensation circuit 320 may receive one of the first driving current ID1 to the $n^{th}$ driving current IDn during different time periods. In this embodiment, the compensation circuit 320 receives the first driving current ID1 and compensates for the first driving current ID1 flowing through the tunable element EE during the first time period, the compensation circuit 320 receives the second driving current ID2 and compensates for the second driving current ID2 flowing through the tunable element EE during the second time period, and so on and so forth.

In this embodiment, the selection circuit 330 is electrically connected to the data line DL. The selection circuit 330 receives the data voltage Vdata from the data line DL. The compensation circuit 320 compensates for the first driving current ID1 to the $n^{th}$ driving current IDn based on the data voltage Vdata. As a result, the current values of the first driving current ID1 to $n^{th}$ driving current IDn being compensated for are approximately the same as the driving current of the tunable element EE without an occurrence of leakage current. According to some embodiments, the selection circuit 330 and the compensation circuit 320 may be disposed within the active area 80A of the substrate 80, and the first power supply circuit 310_1 to the $n^{th}$ power supply circuit 310_n may be disposed within the peripheral area 80B.

Figure 6:
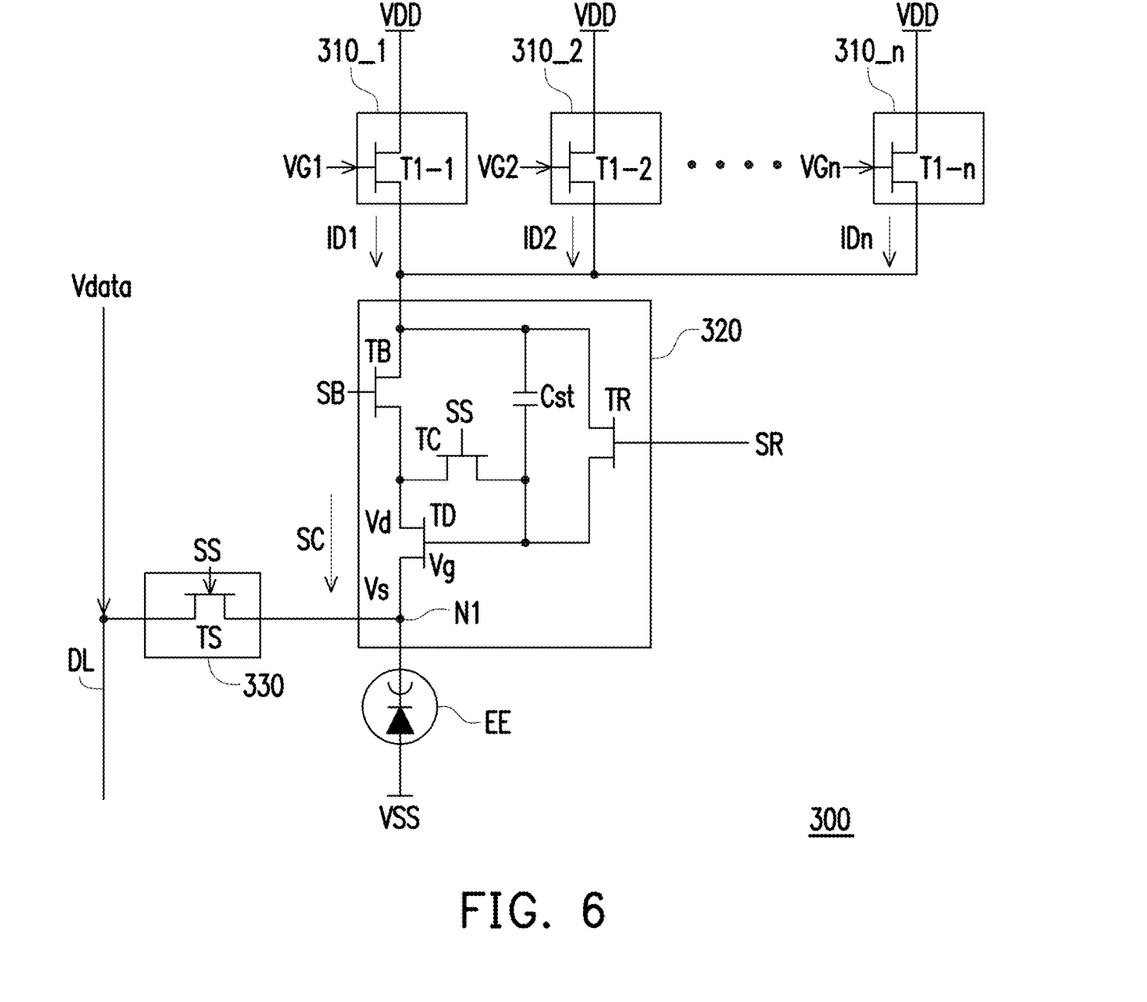
FIG. 6 is a circuit diagram of an electronic device according to the third embodiment of the disclosure.

With reference to FIG. 6, FIG. 6 is a circuit diagram of an electronic device according to the third embodiment of the disclosure. In this embodiment, the first power supply circuit 310_1 includes the power supply transistor T1-1, and the second power supply circuit 310_2 includes the power supply transistor T1-2. The first power supply circuit 310_1 is electrically connected to the compensation circuit 320 and is configured to provide the first driving current ID1 during the first time period. The second power supply circuit 310_2 is electrically connected to the compensation circuit 320 and is configured to provide the second driving current ID2 during the second time period. The first terminal of the power supply transistor T1-1 receives the high reference voltage VDD. The second terminal of the power supply transistor T1-1 is electrically connected to the compensation circuit 320. The control terminal of the power supply transistor T1-1 receives the control signal VG1. The power supply transistor T1-1 may provide the first driving current ID1 according to the control signal VG1 during the first time period. The second power supply circuit 310_2 includes the power supply transistor T1-2. The first terminal of the power supply transistor T1-2 receives the high reference voltage VDD. The second terminal of the power supply transistor T1-2 is electrically connected to the compensation circuit 320. The control terminal of the power supply transistor T1-2 receives the control signal VG2. The power supply transistor T1-2 may provide the second driving current ID2 according to the control signal VG2 during the second time period. By analogy, the $n^{th}$ power supply circuit 310_n includes the power supply transistor T1-n. The first terminal of the power supply transistor T1-n receives the high reference voltage VDD. The second terminal of the power supply transistor T1-n is electrically connected to the compensation circuit 320. The control terminal of the power supply transistor T1-n receives the control signal VGn. The power supply transistor T1-n may provide the $n^{th}$ driving current IDn according to the control signal VGn during the $n^{th}$ time period.

The selection circuit 330 includes the scan transistor TS. The first terminal of the scan transistor TS is electrically connected to the data line DL to receive the data voltage Vdata. The second terminal of the scan transistor TS is electrically connected to the compensation circuit 320. The control terminal of the scan transistor TS receives the selection signal SS.

According to some embodiments, as shown in FIG. 6, the compensation circuit 320 may include a bias transistor TB, a compensation transistor TC, a driving transistor TD, a reset transistor TR, and the storage capacitor Cst. A first terminal of the bias transistor TB is electrically connected to the first power supply circuit 310_1 to the $n^{th}$ power supply circuit 310_n. A second terminal of the bias transistor TB is electrically connected to a first terminal of the driving transistor TD. A control terminal of the bias transistor TB receives a bias signal SB. A second terminal of the driving transistor TD is electrically connected to the selection circuit 330 and the tunable element EE through a node N1. A first terminal of the compensation transistor TC is electrically connected to the second terminal of the bias transistor TB. A second terminal of the compensation transistor TC is electrically connected to a control terminal of the driving transistor TD. A control terminal of the compensation transistor TC receives the selection signal SS. The storage capacitor Cst is electrically connected to the first terminal of the bias transistor TB and the control terminal of the driving transistor TD. A first terminal of the reset transistor TR is electrically connected to the first terminal of the bias transistor TB. A second terminal of the reset transistor TR is electrically connected to the control terminal of the driving transistor TD. A control terminal of the reset transistor TR receives a reset signal SR.

In this embodiment, the bias transistor TB, the compensation transistor TC, the driving transistor TD, and the reset transistor TR may each be implemented with an N-type transistor. The bias transistor TB, the compensation transistor TC, the driving transistor TD, and the reset transistor TR are each an N-type thin film transistor or an NMOS transistor, for example.

Figure 7:
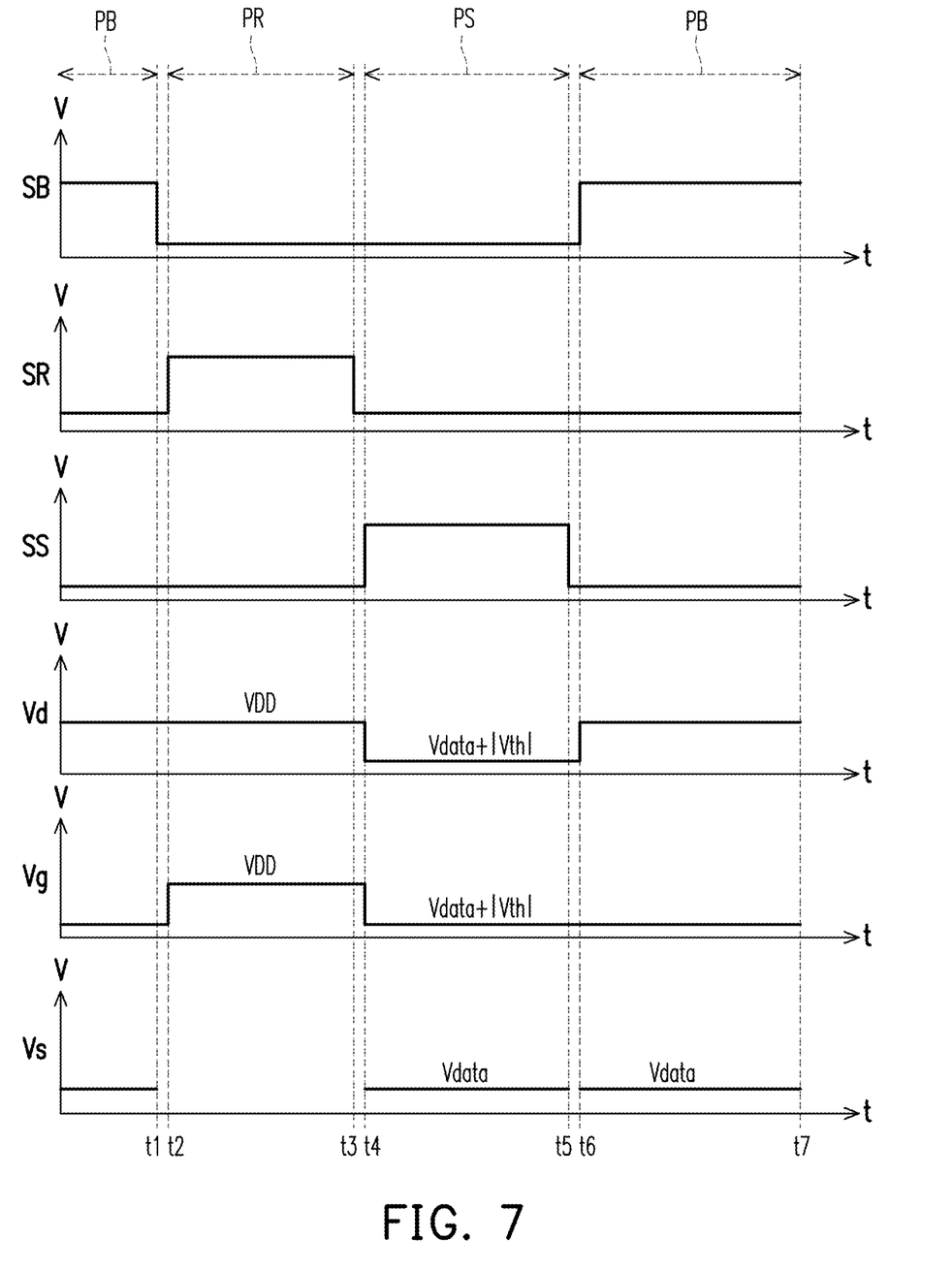
FIG. 7 is a timing diagram according to FIG. 6.

With reference to FIG. 6 and FIG. 7 together, FIG. 7 is a timing diagram according to FIG. 6. The timings in this embodiment are under the circumstances where the power supply transistors T1-1 to T1-n are time-divisionally turned on. A voltage Vd at the first terminal of the driving transistor TD is at the reference high voltage VDD in a previous bias period PB before a time point t1. During a reset period PR from a time point t2 to a time point t3, the reset transistor TR is turned on by the reset signal SR having a high voltage level. The bias signal SB and the selection signal SS have a low voltage level. Therefore, the bias transistor TB, the scan transistor TS, and the compensation transistor TC are turned off. The control terminal of the driving transistor TD may receive the reference high voltage VDD. In addition, the voltage Vd at the first terminal of the driving transistor TD may be maintained in a working state. During the reset period PR from the time point t2 to the time point t3, a voltage Vg at the control terminal of the driving transistor TD and the voltage Vd at the first terminal of the driving transistor TD are approximately equal to the reference high voltage VDD.

During a scan period PS from a time point t4 to a time point t5, the bias transistor TB is turned off according to the bias signal SB having a low voltage level. The scan transistor TS and the compensation transistor TC are turned on according to the selection signal SS having a high voltage level, so that the driving transistor TD is operated in a diode-connected manner. In addition, the data line DL may provide the data voltage Vdata through the scan transistor TS, the driving transistor TD, and the compensation transistor TC to the control terminal of the driving transistor TD. Therefore, the voltage Vg at the control terminal of the driving transistor TD may be a voltage of Vdata+|Vth|. Vth is a threshold voltage of the driving transistor TD. The voltage Vd at the first terminal of the driving transistor TD is also a voltage of Vdata+|Vth|. Moreover, a voltage Vs at the second terminal of the driving transistor TD is the data voltage Vdata.

During a bias period PB from a time point t6 to a time point t7, the bias transistor TB is turned on according to the bias signal SB having a high voltage level. The scan transistor TS and the compensation transistor TC are turned off according to the selection signal SS having a low voltage level. Since the bias transistor TB is turned on, the voltage Vd at the first terminal of the driving transistor TD is the high reference voltage VDD. The voltage Vg of the control terminal of the driving transistor TD is maintained at the voltage of Vdata+|Vth|. The voltage Vs at the second terminal of the driving transistor TD may be the data voltage Vdata. At the same time, the tunable element EE works in a working state, and the second terminal of the driving transistor TD provides the received driving current to the tunable element EE according to the working voltage VDD.

In an occurrence of leakage current in the tunable element EE, a voltage at the node N1 may be dropped. The voltage Vs at the second terminal of the driving transistor TD may also be dropped. According to some embodiments, the voltage Vg at the control terminal of the driving transistor TD may be a voltage of Vdata+|Vth|, and the voltage Vs at the second terminal of the driving transistor TD is the data voltage Vdata. Therefore, the driving transistor TD may provide a fixed driving current SC (i.e., one of the first driving current ID1 to the $n^{th}$ driving current IDn being compensated for) to the tunable element EE based on a fixed voltage difference between the control terminal of the driving transistor TD and the second terminal of the driving transistor TD. In addition, the voltage Vs at the second terminal of the driving transistor TD may compensate for the voltage loss caused by the leakage current of the tunable element EE.

In summary of the foregoing, the electronic device according to the embodiments of the disclosure includes the first power supply circuit and the second power supply circuit electrically connected to the tunable element. The first power supply circuit may drive the tunable element during the first time period, and the second power supply circuit may drive the same tunable element during the second time period. Accordingly, the first power supply circuit and the second power supply circuit time-divisionally drive the tunable element. The first power supply circuit and the second power supply circuit may rest alternately. As such, the likelihood of deterioration of the first power supply circuit and the second power supply circuit under long-term operation is reduced, thus improving the stability during operation of electronic elements. According to some embodiments of the disclosure, the electronic device can also compensate for the leakage current of the tunable element.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
an electronic element;
a first power supply circuit electrically connected to the electronic element;
a second power supply circuit electrically connected to the electronic element; and
a selection circuit configured to provide a data voltage according to a voltage value of a selection signal and to provide the data voltage to the first power supply circuit and the second power supply circuit,
wherein the first power supply circuit drives the electronic element during a first time period, and the second power supply circuit drives the electronic element during a second time period,
wherein the first power supply circuit comprises:
a compensation circuit compensating for the first power supply circuit with the data voltage.

2. The electronic device according to claim 1, wherein:
the first power supply circuit further comprises a source follower circuit, and
the compensation circuit compensates for the source follower circuit with the data voltage.

3. The electronic device according to claim 1, wherein the selection circuit is turned on during a scan time, and the scan time comprises the first time period and the second time period.

4. The electronic device according to claim 1, wherein the first time period is adjacent to the second time period.

5. The electronic device according to claim 1, comprising a substrate, wherein the substrate comprises an active area and a peripheral area, the peripheral area is adjacent to the active area, and the first power supply circuit and the second power supply circuit are disposed within the active area.

6. The electronic device according to claim 1, wherein the source follower circuit electrically connected to a first node, the source follower circuit comprising a control terminal,
wherein a voltage at the first node follows a voltage at the control terminal, and the voltage at the first node is supplied to the electronic element during the first time period.

7. An electronic device comprising:
an electronic element;
a first power supply circuit electrically connected to the electronic element;
a second power supply circuit electrically connected to the electronic element;
a selection circuit configured to provide a data voltage according to a voltage value of a selection signal and to provide the data voltage to the first power supply circuit and the second power supply circuit; and
a compensation circuit electrically connected to the electronic element,
wherein the first power supply circuit drives the electronic element during a first time period, and the second power supply circuit drives the electronic element during a second time period,
wherein the compensation circuit is configured to compensate for a first driving current flowing to the electronic element during the first time period and to compensate for a second driving current flowing to the electronic element during the second time period.

8. The electronic device according to claim 7, wherein the first power supply circuit comprises:
a first power supply transistor electrically connected to the compensation circuit and configured to provide the first driving current during the first time period, and the second power supply circuit comprises:
a second power supply transistor electrically connected to the compensation circuit and configured to provide the second driving current during the second time period.

9. The electronic device according to claim 7, wherein the compensation circuit comprises:
a driving transistor, wherein a second terminal of the driving transistor is electrically connected to a selection circuit and the electronic element through a node, and the selection circuit provides the data voltage.

* * * * *